United States Patent [19]

Levine

[11] 4,032,976

[45] June 28, 1977

[54] SMEAR REDUCTION IN CCD IMAGERS

[75] Inventor: Peter Alan Levine, Trenton, N.J.

[73] Assignee: RCA Corporation, New York, N.Y.

[22] Filed: Apr. 16, 1976

[21] Appl. No.: 677,755

[52] U.S. Cl. .................................. 358/213; 357/24; 357/30

[51] Int. Cl.² .................. H04N 3/14; H01L 29/78; H01L 31/00

[58] Field of Search ........... 307/221 D; 357/24, 30; 250/211 J; 358/213, 241

[56] References Cited
UNITED STATES PATENTS

| | | | |
|---|---|---|---|
| 3,866,067 | 2/1975 | Amelio | 357/24 X |
| 3,931,463 | 1/1976 | Levine | 178/7.1 |
| 3,934,161 | 1/1976 | Caywood | 307/221 D X |

*Primary Examiner*—John C. Martin
*Assistant Examiner*—Aristotelis M. Psitos
*Attorney, Agent, or Firm*—H. Christoffersen; Samuel Cohen

[57] ABSTRACT

Radiation illuminating the A register of a charge-coupled device (CCD) imager of the field transfer type during the transfer of a field from A to the B register results in smear in the reproduced image. Such smear is reduced by removing any charge which may be present in the A register, during a period which begins just after the transfer of a field from the A to the B register, and which terminates when the integration of the next field begins.

3 Claims, 8 Drawing Figures

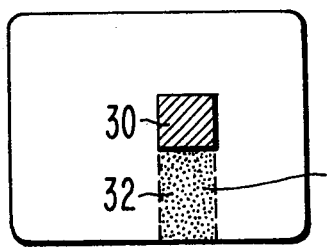 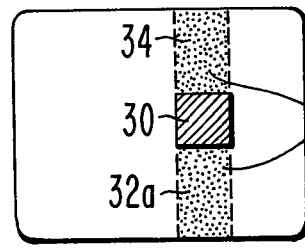
Fig. 3a  Fig. 3b
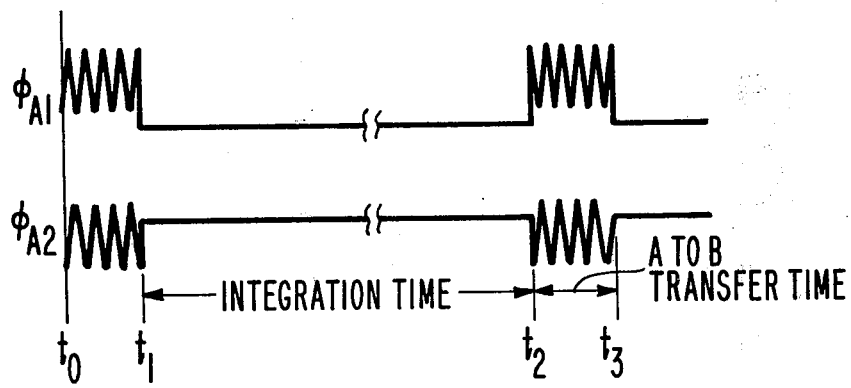
Fig. 4
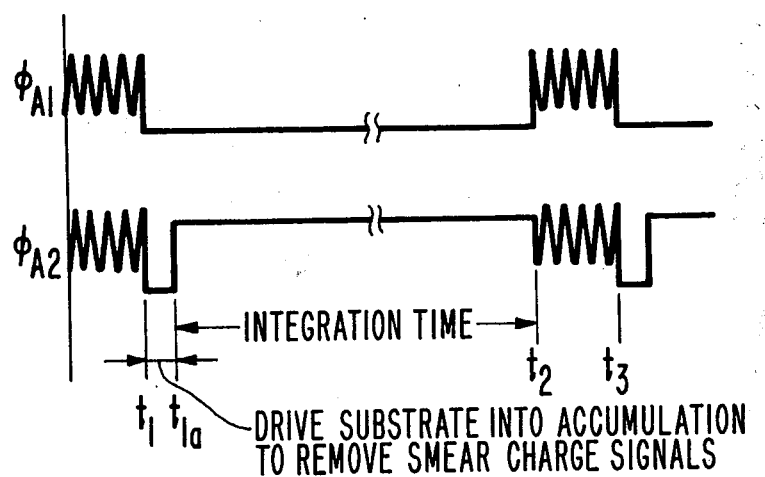
Fig. 5

SMEAR REDUCTION IN CCD IMAGERS

The present application deals with charge-coupled device imagers and more particularly with the problem of smear in such imagers. In the drawing:

FIGS. 3a and 3b show how smear is manifested in the reproduced image;

FIG. 4 illustrates waveforms employed in the operation of the system of FIG. 1; and FIG. 5 illustrates waveforms employed in accordance with one embodiment of the present invention.

Figure 1:
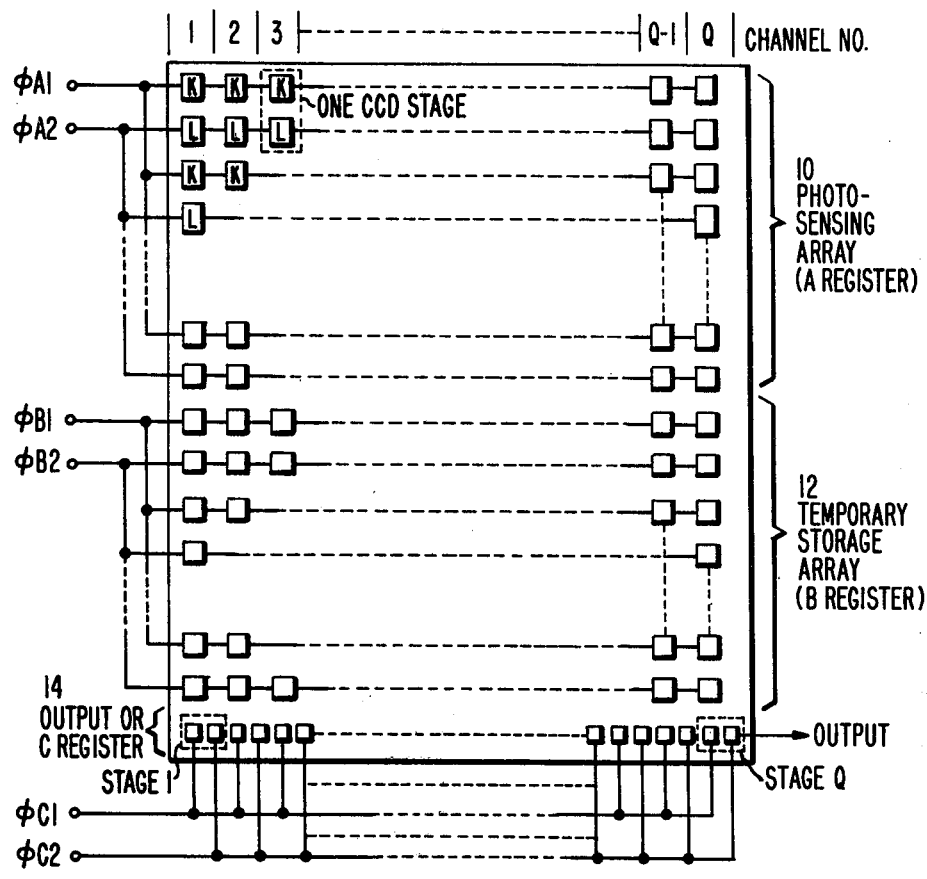
FIG. 1 is a schematic showing of a known CCD imager of the field-transfer type.

The known system of FIG. 1, a two-phase charge-coupled device (CCD) imager, includes a photosensing array 10, known as an A register, a temporary storage array 12, known as a B register, and an output register 14, known as a C register. The B and C registers are masked, that is, means are provided for preventing a radiant energy image from reaching either register.

The A and B registers may have channel stops (not shown explicitly) extending in the column direction to isolate the channels (the columns of the CCD) from one another. The electrodes (K and L, per stage) shown schematically, may be any one of the usual overlapped polysilicon, or polysilicon overlapped by metal, or other two-phase structures for insuring unidirectional signal propagation. The imager, while illustrated to be two-phase operated may, of course, be a three or higher phase operated imager instead. One such imager commercially available from RCA Corporation is SiD 51232 and known as "Big Sid" is three-phase operated and has 320 columns and 512 rows (256 in the A register and 256 in the B register).

The operation of the array of FIG. 1 is well understood. During the so-called integration time the fixed period of time $t_1-t_2$ which is a fixed fraction of the field time $t_1-t_3$, a scene or other image is projected onto the A register. The light or other radiant energy of the image causes charges to be produced at the various locations of the A register, in accordance with the light intensity reaching the respective locations.

Upon the completion of the integration time (during the vertical blanking interval of commercial television), the charge signals which have accumulated (a "field") are transferred, in parallel, in the column direction from the A to the B register by the application of the multiple phase voltages $\phi_{A1}$, $\phi_{A2}$, $\phi_{B1}$ and $\phi_{B2}$. The charges subsequently are transferred, a row at a time, from the B register to the C register, and after each row of charges reaches the C register, it is serially shifted out of the C register in response to the shift voltages $\phi_{C1}$, $\phi_{C2}$. The serial shifting of the C register occurs at a relatively high speed (during a "line time" of commercial television). During the transfer of a field from the B to the C register, a new field may be integrated in the A register.

The waveforms applied to the A register are shown in FIG. 4. From $t_1$ to $t_2$ integration of charge takes place. The substrate is assumed to be P type (N channel) and surface channel CCD operation is assumed. The $\phi_{A1}$ electrode (K in FIG. 1) may be held at a relatively negative potential, as shown, to maintain the substrate regions beneath these electrodes in accumulation to achieve so called "operational blooming control." The $\phi_{A2}$ electrodes (L in FIG. 1) are held at a relatively positive potential to form depletion regions beneath these electrodes for the accumulation of radiation induced charge signals.

During the period $t_2$ to $t_3$ the charge signals accumulated are shifted from the A to the B register. The waveforms are shown only in a schematic way, their actual shapes being well understood in the art. During such transfer of charge signals, the radiation which continues to illuminate the A register produces smear in the reproduced image. The smear is directly proportional to the radiation intensity and to the number of rows illuminated (the size in the column direction of the image), and inversely proportional to the speed of transfer from the A to the B register. The mechanism by which the smear is generated is illustrated in FIG. 2 which describes what occurs when a bright image is present. It is to be understood, of course, that not-so-bright images also cause smear to be produced but at a lower intensity.

Figure 2A:
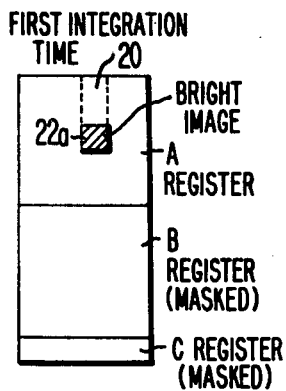
FIGS. 2a–2c are schematic showings which illustrate the problem of smear.

Referring first to FIG. 2a, assume that a scene (not shown) is being imaged onto the A register of the imager and that this scene includes a bright image, illustrated schematically by the square cross hatched area 22a. In the discussion which follows, only this bright image will be considered. During the first integration time, shown in FIG. 2a, the bright image causes charges to accumulate in the area of the substrate illuminated by the bright image.

Figure 2B:
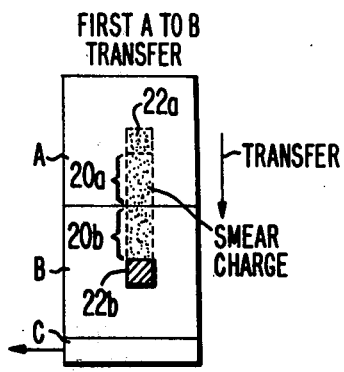

FIG. 2b illustrates what occurs during the first transfer of the field in the A register to the B register. This occurs, as already mentioned, during the vertical blanking time and at relatively high speed. During the transfer, the A register is not shuttered or masked in any other way. Therefore, the bright image remains focused on the substrate as the multiple phase voltages applied to the A and B registers transfer the charges from the A to the B register. During the transfer, the potential wells formerly in the region 20 of FIG. 1 pass beneath the bright image. While they do move at a relatively high speed, the bright image does cause a certain amount of charge signal to be produced and to accumulate in these potential wells. The greater the transfer speed, the fewer charges which will accumulate; however, the maximum speed at which the transfer can take place is limited by such factors as the capacitance and resistance of the charge transfer electrodes and other factors.

The result of the above is illustrated in FIG. 2b which shows the condition of the imager at the end of the first transfer time. The B register is storing the charge at 22b which was transferred from 22a of the A register. In the region 20b of the B register smear charge is present. This region 20b corresponds to the region 20 of FIG. 2a. There is also smear charge present in region 20a of the A register. Region 20a consists of potential wells moved under the bright image but which were not propagated sufficiently far to reach the B register.

Figure 2C:
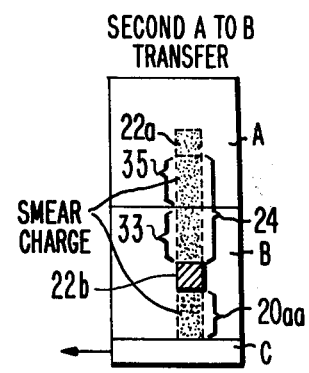

After the first transfer illustrated in FIG. 2b, there is a second integration time which is not illustrated and then a transfer of the second field from the A to the B register. At the end of the second transfer, the situation is as depicted in FIG. 2c. The smear charge formerly at 20a (FIG. 2b) has been shifted to position 20aa and there is also smear charge in the region 24 for reasons similar to those just discussed in connection with 20a and b of FIG. 2b.

As already mentioned, the charge signals transferred to the B register are later shifted out, a line at a time, to the C register and the contents of the C register are then transferred serially out of the C register. The signals shifted out of the C register are video signals and they may be subsequently displayed on the screen of a kinescope. The display, after the first transfer, is shown in FIG. 3a. There is a bright image at 30 corresponding to the bright image which caused the charge pattern 22a of FIG. 2a and there is smear at 32 below the bright image. Note here that the optical system in the imager causes the image projected on to the imager to be an upside-down version of the original scene and the read-out, bottom line first, followed by the reconstituting of the image on the kinescope screen starting at the top line first, turns the picture over again. This is the reason the smear 32 appears at the bottom in the displayed image and on the top (20b) of the B register in FIG. 2b. Note also that the assumption is made in the illustrations of FIG. 2 that the observer is facing the surface illuminated of the A register and that the C register is read out right-to-left.

The smear 32 manifests itself as illumination at a lower intensity than the image 30 but which can be sufficiently visible appreciably to affect picture quality. Even five to ten percent smear is noticeable and it is not unusual to have smear levels of thirty percent or more of the intensity of the image 30. The latter are especially disturbing.

The display of FIG. 3a occurs only once and ordinarily is not seen, as such, by the observer. Rather the latter sees the display of FIG. 3b which occurs at the field repetition rate. The display of FIG. 3b corresponds to the charge pattern stored in the B register as shown in FIG. 2c. Note there is smear in the reproduced image both below and above the bright region 30. The smear 32a below the image corresponds to the smear charge at 33 above the information charge 22b in FIG. 2c and the smear 34 (FIG. 3b) above the image corresponds to the smear charge 20aa (FIG. 2c) below 22b. The reason for the inversion already has been mentioned.

In FIG. 2c if one considers the smear charge 33 to have been produced during the integration of some arbitrary field N, then the smear charge at 20aa can be said to have been produced during the integration of the previous field N-1. This should be clear from FIG. 2b. The smear charge at 20a is produced during field N-1. During the following field N, this charge becomes stored at 20aa in the B register while the smear generated during the transfer of field N becomes stored at 33.

Smear may be substantially reduced in accordance with an embodiment of the present invention, by employing the waveforms of FIG. 5 rather than those of FIG. 4. The $\phi_{A1}$ waveform is identical to the one previously employed; however, the $\phi_{A2}$ waveform is not. The difference is that prior to the beginning of the integration time, that is, during the period $t_1$-$t_{1a}$, the $\phi_{A2}$ electrodes receive a relatively negative voltage—one sufficiently negative to drive the regions of the substrate beneath the L electrodes of FIG. 1 into accumulation. The negative voltage is applied only once each field time, for a fixed time period (the period between $t_1$ and $t_{1a}$) and it's occurrence (and duration) is independent of operating parameters such as image intensity. In other words, this negative voltage is unconditionally applied once each field time (during each period $t_1$-$t_{1a}$ of each field time $t_1$-$t_3$). In response thereto, any smear charge signals remaining in the A register are unconditionally removed once each filed time. The smear charge such as that at 20a in FIG. 2b or 35 in FIG. 2c comprises minority charge carriers. These recombine with majority charge carriers during the period $t_1$-$t_{1a}$. Such majority carriers are attracted to the region of the substrate beneath the L electrodes in response to the relatively negative voltage applied to these electrodes and such majority carriers also are present beneath the fixed K electrodes. The period $t_1$-$t_{1a}$ is only a small fraction of a field time. For example, $t_1$-$t_{1a}$ may be 0.1 millisecond or so for a system in which a field time ($t_1$-$t_3$) is 1/60 sec. or 1/30 sec. (dependent upon whether or not interlace is employed). The integration time $t_{1a}$-$t_2$ is a fixed interval of time (equal to a fixed fraction of the field time).

The effect of operating in the way described is that there is no smear charge signal to transfer from a region such as 35 in FIG. 2c to a region such as 20aa in this same figure during the following A to B transfer time $t_2$-$t_3$. As the charge signal 20aa is absent from the B register, the corresponding smear 34 in FIG. 3b in the reproduced image is absent from the reproduced image. Therefore, the image reproduced during each field time is not that shown in FIG. 3b but rather will correspond to that shown in FIG. 3a. Of course, this image may still have some smear and if it is present, it appears below the image. The lower in position the bright image in the picture, the more smear which is cancelled and conversely, the higher in position the bright image in the picture, the less smear which is cancelled. While it is true that the smear cancellation is not complete, it is an improvement over what is shown in FIG. 3b and it has the important advantage that the improvement is obtained at virtually no cost. No structural changes are needed in the array. The only change needed is in the $\phi_{A2}$ waveform and this can be achieved with only minor modification of the waveform generator of the CCD imager system. It also has been found that operating in the way described smear generated and stored in the A register due to dark current spots in the A register.

What is claimed is:

1. In a CCD imager of the type having an imaging region comprising a plurality of columns and a plurality of rows of image sensing locations onto which an image is projected for producing a charge pattern field and in which, after a fixed interval of time the pattern produced is periodically transferred out of the imaging region while the image remains projected thereon, whereby smear charge signals are produced during such transfer, and wherein each transferred pattern is subsequently read-out during a field time, a method for substantially reducing the effect of the smear charge signals comprising the step of:

unconditionally removing the smear charge signals remaining in the imaging region, only once each field time, after each transfer of a charge pattern field out of the imaging region and just prior to the production of the next charge pattern field, during a fixed period which is only a small fixed fraction of said fixed interval of time and whose duration is independent of the image intensity.

2. A CCD imager system comprising, in combination:

a CCD imager of the type including an A register onto which an image is projected, said register including a substrate, a plurality of columns and a plurality of rows of integrating electrodes adjacent to said substrate which during successive fixed intervals of time are maintained at a potential such that depletion regions are formed in the substrate for collecting charges in response to said projected image, and a masked B register comprising columns and rows of charge storage locations to which the charge pattern of the A register is shifted once each field time, after each field has been integrated in the A register and while the A register remains unmasked; and means for unconditionally changing the potential applied to said electrodes, to a value such that accumulation regions are formed in the substrate, for a fixed period once each field which starts after each A register to B register transfer and which terminates before each integration time and which is a small fixed fraction of said fixed interval of time.

3. A method of operating charge transfer imager of the type including an imaging area having a semiconductor substrate and columns and rows of electrodes adjacent to the substrate, means during each of successive integration times of fixed duration during which an image is projected onto said substrate for maintaining certain of the electrodes at a potential to form potential wells in the substrate and other of the electrodes at a potential to form potential barriers in the substrate between adjacent potential wells, and which also includes means for applying multiple phase voltages to sad electrodes upon the completion of each integration time for transferring a field of charge signals which have accumulated in said potential wells out of said imaging area, the step of:

unconditionally applying to said certain electrodes, only once each field period, a potential to place the regions of the substrate adjacent thereto in accumulation, during the part of said field period which starts after said charge signals have been shifted out of said imaging area and which terminates before the following integration time and which is independent of the duration of the integration time and of the image intensity, whereby any smear charge signals generated and stored in said imaging area each time charge signals are shifted out of said imaging area, are removed from said imaging area, prior to each following integration time.

* * * * *

UNITED STATES PATENT OFFICE
CERTIFICATE OF CORRECTION

PATENT NO. : 4,032,976
DATED : June 28, 1977
INVENTOR(S) : Peter Alan Levine

It is certified that error appears in the above-identified patent and that said Letters Patent are hereby corrected as shown below:

Column 1, line 41, "$t_1-t_3$)." should read --$t_1-t_3$),--.

Column 4, line 41, after "described" insert --reduces--.

Signed and Sealed this

Eleventh Day of October 1977

[SEAL]

Attest:

RUTH C. MASON
*Attesting Officer*

LUTRELLE F. PARKER
*Acting Commissioner of Patents and Trademarks*